US012712557B2

(12) United States Patent
Wang et al.

(10) Patent No.: US 12,712,557 B2
(45) Date of Patent: Aug. 18, 2026

(54) INPUT COMMON-MODE COMPENSATION CIRCUIT AND METHOD AND PIPELINED ANALOG-TO-DIGITAL CONVERTER

(71) Applicant: Chongqing GigaChip Technology Co., Ltd., Chongqing (CN)

(72) Inventors: Yizhou Wang, Chongqing (CN); Lu Liu, Chongqing (CN); Daiguo Xu, Chongqing (CN); Can Zhu, Chongqing (CN); Dongbing Fu, Chongqing (CN); Hequan Jiang, Chongqing (CN); Ruzhang Li, Chongqing (CN); Jianan Wang, Chongqing (CN); Zhou Yu, Chongqing (CN); Zhengping Zhang, Chongqing (CN)

(73) Assignee: Chongqing GigaChip Technology Co., Ltd., Chongqing (CN)

( * ) Notice: Subject to any disclaimer, the term of this patent is extended or adjusted under 35 U.S.C. 154(b) by 124 days.

(21) Appl. No.: 18/919,449

(22) Filed: Oct. 18, 2024

(65) Prior Publication Data

US 2025/0070791 A1 Feb. 27, 2025

Related U.S. Application Data

(63) Continuation of application No. PCT/CN2022/099444, filed on Jun. 17, 2022.

(30) Foreign Application Priority Data

May 18, 2022 (CN) ......................... 202210548026.4

(51) Int. Cl.
*H03M 1/06* (2006.01)
*H03F 3/45* (2006.01)
(Continued)

(52) U.S. Cl.
CPC ........ *H03M 1/0617* (2013.01); *H03F 3/4547* (2013.01); *H03F 3/45475* (2013.01);
(Continued)

(58) Field of Classification Search
CPC .. H03M 1/0617; H03M 1/0607; H03M 1/164; H03M 1/38; H03F 3/45932;
(Continued)

(56) References Cited

U.S. PATENT DOCUMENTS 8,184,033 B2 * 5/2012 Wang .................. H03M 1/0602 341/161
9,716,513 B1 7/2017 Chen et al.
11,177,821 B1 * 11/2021 Steensgaard-Madsen .................. H03M 1/0607

FOREIGN PATENT DOCUMENTS

CN 103944573 A 7/2014
CN 107528594 A 12/2017
(Continued)

*Primary Examiner* — Khai M Nguyen

(57) ABSTRACT

An input common-mode compensation circuit includes an energy storage module, a switching selection module, and a feedback compensation module. An end of the energy storage module is connected to an input end of the residual amplifier. An input end of the switching selection module is connected to another end of the energy storage module. Input ends of the feedback compensation module are respectively connected to the end of the energy storage module and to a reset voltage of the residual amplifier, and an output end of the feedback compensation module is connected to an output end of the switching selection module. During the reset stage of a residual amplifier, the energy storage module is charged under the action of a reset voltage. During the working stage of the residual amplifier, feedback compensation is performed on the energy storage module through the feedback compensation module.

18 Claims, 3 Drawing Sheets

(51) Int. Cl.
*H03M 1/16* (2006.01)
*H03M 1/38* (2006.01)

(52) U.S. Cl.
CPC ...... *H03F 3/45932* (2013.01); *H03M 1/0607* (2013.01); *H03M 1/164* (2013.01); *H03M 1/38* (2013.01); *H03F 2203/45512* (2013.01); *H03F 2203/45514* (2013.01); *H03F 2203/45551* (2013.01)

(58) Field of Classification Search
CPC . H03F 2203/45512; H03F 2203/45514; H03F 2203/45551; H03F 3/45475; H03F 3/45479
USPC .......................................... 341/118, 155, 161
See application file for complete search history.

(56) References Cited

FOREIGN PATENT DOCUMENTS

| | | | |
|---|---|---|---|
| CN | 107800435 | A | 3/2018 |
| CN | 109004911 | A | 12/2018 |

* cited by examiner

INPUT COMMON-MODE COMPENSATION CIRCUIT AND METHOD AND PIPELINED ANALOG-TO-DIGITAL CONVERTER

CROSS REFERENCE TO RELATED APPLICATION

The present patent document is a continuation application of PCT Application Serial No. PCT/CN2022/099444, filed on Jun. 17, 2022, designating the United States, and claiming the priority to Chinese Application Serial No. 202210548026.4, filed on May 18, 2022, and contents of both applications are herein incorporated by reference in their entirety for all purposes.

TECHNICAL FIELD

The present application relates to the technical field of integrated circuits, and in particular to input common-mode compensation circuits, input common-mode compensation methods, and pipelined analog-to-digital converters.

BACKGROUND

A residual amplifier in a high-speed pipelined analog-to-digital converter (ADC) usually has an amplifier structure adopting a fully differential switched capacitor, which controls the voltage level at both ends of the capacitor by switches and generates the input signal and the output signal corresponding to the amplifier by charge redistribution.

SUMMARY

In an aspect of the present application, an input common-mode compensation circuit used to compensate the common-mode value of an input signal of a residual amplifier in a pipelined analog-to-digital converter includes: an energy storage module, where one end of the energy storage module is connected to an input end of a residual amplifier; a switching selection module, where an input end of the switching selection module is connected to the other end of the energy storage module, and a first output end of the switching selection module is grounded; and a feedback compensation module, where a first input end of the feedback compensation module is connected to one end of the energy storage module connected to the residual amplifier, a second input end of the feedback compensation module is connected to a reset voltage of the residual amplifier, and an output end of the feedback compensation module is connected to a second output end of the switching selection module.

During a reset stage of the residual amplifier, the input end of the switching selection module is connected to the first output end of the switching selection module, and the energy storage module is charged under the action of the reset voltage, during a working stage of the residual amplifier, the input end of the switching selection module is connected to the second output end of the switching selection module, and feedback compensation is applied to the energy storage module by the feedback compensation module, thereby compensating and adjusting a common-mode value of an input signal of the residual amplifier.

In some embodiments of the present application, the energy storage module includes a first capacitor and a second capacitor, one end of the first capacitor is connected to the non-inverting input end of the residual amplifier, and one end of the second capacitor is connected to the inverting input end of the residual amplifier.

In some embodiments of the present application, the switching selection module includes a first switch unit and a second switch unit; the first switch unit includes a first switch and a second switch, the input end of the first switch is connected to the other end of the first capacitor, the output end of the first switch is grounded, the input end of the second switch is connected to the other end of the second capacitor, and the output end of the second switch is grounded; the second switch unit includes a third switch and a fourth switch, the input end of the third switch is connected to the other end of the first capacitor, and the input end of the fourth switch is connected to the other end of the second capacitor.

In some embodiments of the present application, the feedback compensation module includes a high slew rate amplifier, a first resistor, and a second resistor, the inverting input end of the high slew rate amplifier is connected to the non-inverting input end of the residual amplifier via the first resistor connected in series, the inverting input end of the high slew rate amplifier is also connected to the inverting input end of the residual amplifier via the second resistor connected in series, the non-inverting input end of the high slew rate amplifier is connected to the reset voltage, and the output end of the high slew rate amplifier is respectively connected to the output end of the third switch and the output end of the fourth switch.

In some embodiments of the present application, during the reset stage of the residual amplifier, the first switch and the second switch are both turned on, the third switch and the fourth switch are both turned off, the first switch unit is turned on, the second switch unit is turned off, and the first capacitor and the second capacitor are respectively charged under the action of the reset voltage, and during the working stage of the residual amplifier, the first switch and the second switch are both turned off, the third switch and the fourth switch are both turned on, the first switch unit is turned off, the second switch unit is turned on, and the common-mode value of the input signal of the residual amplifier is compensated and adjusted by the high slew rate amplifier.

In some embodiments of the present application, the capacitance of the first capacitor is equal to the capacitance of the second capacitor, and the resistance of the first resistor is equal to the resistance of the second resistor.

In another aspect of the present application, a pipelined analog-to-digital converter includes an input common-mode compensation circuit as described in any one of the above items, where the input common-mode compensation circuit is connected to the input end of a residual amplifier in the pipelined analog-to-digital converter, and the input common-mode compensation circuit compensates and adjusts the common-mode value of the input signal of the residual amplifier.

In yet another aspect of the present application, an input common-mode compensation method used to compensate and adjust the common-mode value of the input signal of the residual amplifier in the pipelined analog-to-digital converter includes: providing an input common-mode compensation circuit as described in any one of the above; during the reset stage of the residual amplifier, using a reset voltage at the input end of the residual amplifier to charge an energy storage module; and during a working stage of the residual amplifier, using a feedback compensation module to perform feedback compensation on the energy storage module, thereby compensating and adjusting the common-mode value of the input signal of the residual amplifier.

DESCRIPTION OF EMBODIMENTS

Figure 1:
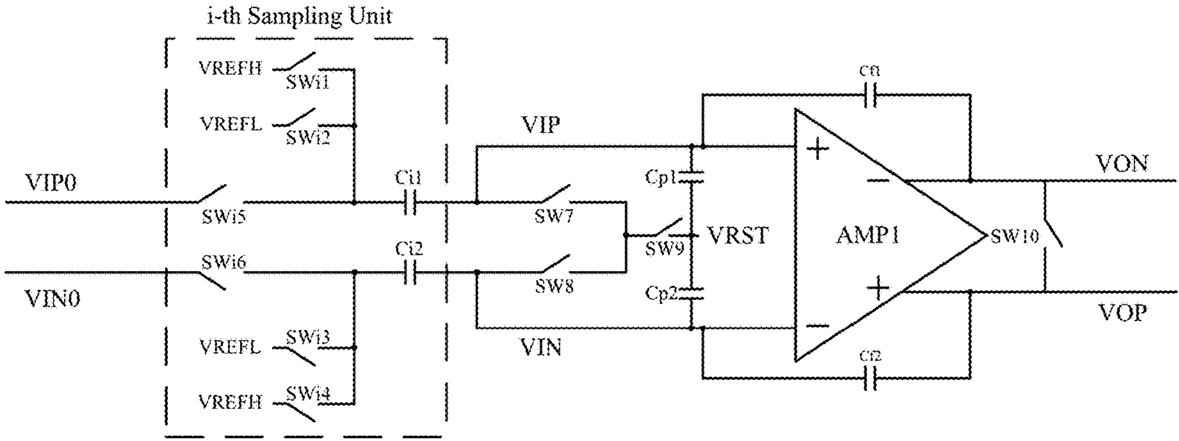
FIG. 1 shows a structural diagram of a circuit of a residual amplifier in a high-speed pipelined analog-to-digital converter.

The following describes the embodiments of the present application through specific examples, and those skilled in the art can easily understand other advantages and effects of the present application from the contents disclosed in this specification. The present application can also be implemented or applied through other different specific embodiments, and the details in this specification can also be modified or changed in various ways based on different viewpoints and applications without departing from the spirit of the present application.

Please refer to FIG. 1 to FIG. 5. It should be noted that the drawings provided in these embodiments only illustrate the basic concept of the present application in a schematic manner, so the drawings only show the components related to the present application and are not drawn according to the number, shape, and size of the components during actual implementation. The type, quantity, and scale of each component during actual implementation can be changed at will, and the component layout type may also be more complicated. The structure, scale, size, etc. shown in the drawings attached to this specification are only used to match the content disclosed in the specification for people familiar with this technology to understand and read and are not used as limiting conditions to limit the implementation of the present application, so they have no technical substantive significance. Any structural modification, change in proportional relationship, or adjustment of size should still fall within the scope of the technical content disclosed by the present application without affecting the effect that the present application can produce and the purpose that the present application can achieve.

The overall structure of a residual amplifier in a high-speed pipelined analog-to-digital converter is shown in FIG. 1. It mainly includes switches SWi1 to SWi6 and SW7 to SW10, capacitors Cf1 to Cf2 and Ci1 to Ci2, and a residual amplifier AMP1. In order to achieve subtraction amplification, it uses N parallel sampling units, where the value of N is an even number greater than or equal to 2, such as 4, 6, 8, etc., and the specific value of N is related to the amplification factor of the residual amplifier. The i-th sampling unit includes switches SWi1 to SWi6 and capacitors Ci1 to Ci2, and the value of i is 1 to N.

As shown in FIG. 1, in the i-th sampling unit, a high reference voltage VREFH is connected to one end of Ci1 via the series-connected switch SWi1, a low reference voltage VREFL is connected to one end of Ci1 via the series-connected switch SWi2, the low reference voltage VREFL is connected to one end of Ci2 via the series-connected switch SWi3, and the high reference voltage VREFH is connected to one end of Ci2 via the series-connected switch SWi4. A positive input signal VIP0 is connected to one end of the capacitor Ci1 via the series-connected switch SWi5, a negative input signal VIN0 is connected to one end of the capacitor Ci2 via the series-connected switch SWi6, the other end of the capacitor Ci1 is connected to the non-inverting input end of the residual amplifier AMP1, that is, the signal at the other end of the capacitor Ci1 is a non-inverting input end signal VIP of the residual amplifier AMP1, the capacitor Ci1 is also connected to a reset voltage VRST via the switches SW7 and SW9 connected in series in sequence, and the other end of the capacitor Ci2 is connected to the inverting input end of the residual amplifier AMP1, that is, the signal at the other end of the capacitor Ci2 is an inverting input end signal VIN of the residual amplifier AMP1. The capacitor Ci2 is also connected to the common end of the switch SW7 and the switch SW9 via the series-connected switch SW8.

As shown in FIG. 1, one end of the capacitor Cf1 is connected to the non-inverting input end of the residual amplifier AMP1, the other end of the capacitor Cf1 is connected to the inverting output end of the residual amplifier AMP1, and the inverting output end of the residual amplifier AMP1 outputs a signal VON. One end of the capacitor Cf2 is connected to the inverting input end of the residual amplifier AMP1, the other end of the capacitor Cf2 is connected to the non-inverting output end of the residual amplifier AMP1, and the non-inverting output end of the residual amplifier AMP1 outputs a signal VOP. In addition, the switch SW10 is connected in series between the non-inverting output end of the residual amplifier AMP1 and the inverting output end of the residual amplifier AMP1.

As shown in FIG. 1, the working principle of the residual amplifier in a conventional high-speed pipelined analog-to-digital converter is as follows.

1) In the reset (sampling) stage, in N parallel sampling units, switches SWi5 and SWi6 are turned on, switches SWi1, SWi2, SWi3, and SWi4 are turned off, switches SW7, SW8, SW9, and SW10 are turned on, and the residual amplifier AMP1 is in a reset state (i.e., not working). At this time, the common-mode value of the signal VOP and the signal VON is determined by the residual amplifier AMP1, and the common-mode value is set to VCMOUT. For ease of understanding, assuming that the value of the input signal is the common-mode value of input signals of two ends (i.e., VIP0=VIN0), the charge conservation expression on the non-inverting input end of the residual amplifier AMP1 is as follows (the inverting input end of the residual amplifier AMP1 is analyzed in the same way):

$$(VIP0 - VRST)CN1 + (VCMOUT - VRST)Cf1 = Q;$$

where it is assumed that the capacitances of the capacitors in the N sampling units are equal, that is, the capacitances of the capacitors are all C0, that is, C11=C12= . . . =Ci1=Ci2= . . . =CN1=CN2=C0, then CN1=N*C0.

2) During the working stage, in the N parallel sampling units, switches SWi5 and SWi6 are turned off, and each group of switches SWi1, SWi2, SWi3, and SWi4 will be reasonably turned on and off according to the result of the comparator. When the value of the input signal is the common-mode value of the input signals of the two ends, in the N parallel sampling units, switches SWi1, SWi2, SWi3, and SWi4 in N/2 sampling units are turned off, switches SWi1, SWi2, SWi3, and SWi4 in N/2 sampling units are turned on, switches SW7, SW8, SW9, and SW10 are turned off, and the residual amplifier AMP1 is in a working stage. It is assumed that the signal at the non-inverting input end of the residual amplifier AMP1 is Vx. At this time, the charge conservation expression at the non-inverting input end of the residual amplifier AMP1 is as follows:

$$(VREFH - Vx)CN1/2 + (VREFL - Vx)CN1/2 + (VCMOUT - Vx)Cf1 = Q.$$

3) According to the law of conservation of charge, the charge Q at the non-inverting input end of the residual amplifier AMP1 in the sampling stage is equal to that during the working stage, so the voltage at the non-inverting input end of the residual amplifier AMP1 in the working state can be solved as follows:

$$Vx = [(CN1 + Cf1) * VRST + CN1 * (CREFH + VREFL)/2 - CN1 * VIP0]/(CN1 + Cf1).$$

Normally, the common-mode value of the two reference voltages (i.e., the high reference voltage VREFH and the low reference voltage VREFL) during sampling, that is, (VREFH+VREFL)/2, is the same as the common-mode value of the input signal, so it is equal to VIP0 here. Therefore, finally, the following equation is obtained:

$$Vx = VRST.$$

Therefore, under normal circumstances, the common-mode value of the input signal of the residual amplifier AMP1 should be equal to the reset voltage VRST.

However, due to the parasitic capacitance of switches SW7, SW8, and SW9 and the parasitic capacitance of the layout, such as the parasitic capacitance Cp1 and parasitic capacitance Cp2 shown in FIG. 1, one end of the parasitic capacitance Cp1 is connected to the non-inverting input end of the residual amplifier AMP1, and the other end of the parasitic capacitance Cp1 is connected to the reset voltage VRST, one end of the parasitic capacitance Cp2 is connected to the inverting input end of the residual amplifier AMP1, and the other end of the parasitic capacitance Cp2 is connected to the reset voltage VRST. During the working stage, the common-mode signal at the input end of the residual amplifier AMP1 will be attenuated due to the charge distribution on the parasitic capacitances Cp1 to Cp2, which can be expressed as follows, for the non-inverting input end of the residual amplifier AMP1 containing the parasitic capacitance Cp1 (which is the same for the inverting input end of the residual amplifier AMP1):

$$Vx = [(CN1 + Cf1) * VRST + CN1 * (VREFH + VREFL)/2 - CN1 * VIP0]/(CN1 + Cf1 + Cp1).$$

Therefore, it can be seen from the above formula that when the parasitic capacitance Cp1 caused by the parasitics of the switching MOSFET and the layout parasitics cannot be ignored, the signal Vx at the non-inverting input end of the residual amplifier AMP1 will be attenuated during the working stage, thereby causing the common-mode value of the input signal of the residual amplifier AMP1 to be attenuated. As mentioned in the background above, the attenuation of the common-mode value of the input signal will cause the quiescent point of the residual amplifier to deviate from the reset value, causing the deterioration of the output swing, linearity, and other performance, and ultimately causing the performance of the pipelined analog-to-digital converter to deteriorate.

This method will inevitably cause a certain deviation in signal generation due to the influence of parasitic capacitance. Especially for the input end of the residual amplifier, the parasitic capacitance on the reset switch will cause the common-mode signal at the input end of the residual amplifier to attenuate under the operating state. The attenuation of the common-mode value will cause the quiescent point of the residual amplifier to deviate from the reset value, causing the deterioration of the output swing, linearity, and other performance, and ultimately making the performance of the pipelined analog-to-digital converter worse.

Therefore, there is an urgent need for a technical solution for input common-mode compensation of a residual amplifier in a pipelined analog-to-digital converter.

Based on this, the present application proposes an input common-mode compensation technical solution. During the reset stage of the residual amplifier, an energy storage module is charged for the first time through the reset voltage, and during the working stage of the residual amplifier, feedback compensation is applied to the energy storage module by a feedback compensation module to achieve a second charging, so as to stabilize the common-mode value of the input signal of the residual amplifier during the working stage near the reset voltage, and suppress the input common-mode attenuation phenomenon of the residual amplifier in the working state caused by the parasitic capacitance of the reset switch.

Figure 2:
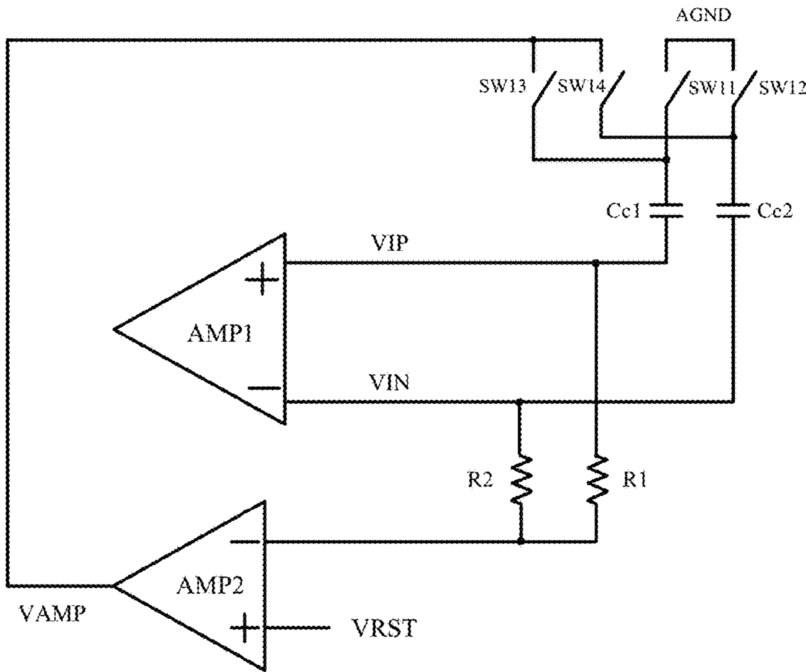
FIG. 2 shows a circuit diagram of an input common-mode compensation circuit according to one or more embodiments of the present application.

First, as shown in FIG. 2, the present application provides an input common-mode compensation circuit for compensating a common-mode value of an input signal of a residual amplifier in a pipelined analog-to-digital converter. The circuit includes: an energy storage module, where one end of the energy storage module is connected to an input end of a residual amplifier AMP1; a switching selection module, where an input end of the switching selection module is connected to the other end of the energy storage module, and a first output end of the switching selection module is connected to the ground AGND; a feedback compensation module, where a first input end of the feedback compensation module is connected to one end of the energy storage module connected to the residual amplifier AMP1, a second input end of the feedback compensation module is connected to the reset voltage VRST of the residual amplifier AMP1, and an output end of the feedback compensation module is connected to a second output end of the switching selection module.

In particular, during the reset stage of the residual amplifier, the input end of the switching selection module is connected to the first output end of the switching selection module, and the energy storage module is charged under the action of the reset voltage VRST; during the working stage of the residual amplifier, the input end of the switching selection module is connected to the second output end of the switching selection module, and feedback-compensation is applied to the energy storage module by the feedback compensation module, thereby compensating and adjusting the common-mode value of the input signal of the residual amplifier.

In some embodiments of the present application, as shown in FIG. 2, the energy storage module includes a first capacitor Cc1, and a second capacitor Cc2. One end of the first capacitor Cc1 is connected to the non-inverting input end of the residual amplifier AMP1, and one end of the second capacitor Cc2 is connected to the inverting input end of the residual amplifier AMP1.

In some embodiments of the present application, as shown in FIG. 2, the switching selection module includes a first switch unit and a second switch unit. The first switch unit includes a first switch SW11 and a second switch SW12, an input end of the first switch SW11 is connected to the other end of the first capacitor Cc1, an output end of the first switch SW11 is connected to the ground AGND, an input end of the second switch SW12 is connected to the other end of the second capacitor Cc2, and an output end of the second switch SW12 is connected to the ground AGND. The second switch unit includes a third switch SW13 and a fourth switch SW14, an input end of the third switch SW13 is connected to the other end of the first capacitor Cc1, and an input end of the fourth switch SW14 is connected to the other end of the second capacitor Cc2.

In some embodiments of the present application, as shown in FIG. 2, the feedback compensation module includes a high slew rate amplifier AMP2, a first resistor R1, and a second resistor R2. An inverting input end of the high slew rate amplifier AMP2 is connected to the non-inverting input end of the residual amplifier AMP1 via the first resistor R1 connected in series. An inverting input end of the high slew rate amplifier AMP2 is also connected to the inverting input end of the residual amplifier AMP1 via the second resistor R2 connected in series. The non-inverting input end of the high slew rate amplifier AMP2 is connected to the reset voltage VRST, and an output end of the high slew rate amplifier AMP2 is respectively connected to the output end of the third switch SW13 and the output end of the fourth switch SW14.

In some embodiments of the present application, as shown in FIG. 2, an input end of the first switch unit and an input end of the second switch unit are connected together as an input end of the entire switching selection module. An output end of the first switch unit is a first output end of the switching selection module, and an output end of the second switch unit is a second output end of the switching selection module. The inverting input end of the high slew rate amplifier AMP2 is the first input end of the feedback compensation module, the non-inverting input end of the high slew rate amplifier AMP2 is the second input end of the feedback compensation module, and the output end of the high slew rate amplifier AMP2 is the output end of the feedback compensation module.

In some embodiments of the present application, in order to balance the impedance of the non-inverting input end of the residual amplifier AMP1 with the impedance of the inverting input end of the residual amplifier AMP1, the capacitance of the first capacitor Cc1 is equal to the capacitance of the second capacitor Cc2, and the resistance of the first resistor R1 is equal to the resistance of the second resistor R2.

In some embodiments of the present application, as shown in FIG. 2, during the reset stage of the residual amplifier AMP1, the first switch SW11, and the second switch SW12 are both turned on, the third switch SW13, and the fourth switch SW14 are both turned off, the first switch unit is turned on, the second switch unit is turned off, and the first capacitor Cc1 and the second capacitor Cc2 are respectively charged under the action of the reset voltage VRST. During the working stage of the residual amplifier AMP1, the first switch SW11, and the second switch SW12 are both turned off, the third switch SW13, and the fourth switch SW14 are both turned on, the first switch unit is turned off, and the second switch unit is turned on, and the common-mode value of the input signal of the residual amplifier AMP1 is compensated and adjusted by the high slew rate amplifier AMP2.

In some embodiments of the present application, as shown in FIG. 2, the input common-mode compensation circuit works as follows.

1) During the reset stage of the residual amplifier AMP1, the first switch SW11, and the second switch SW12 are both turned on, the third switch SW13, and the fourth switch SW14 are both turned off, the first switch unit is turned on, the second switch unit is turned off, and the first capacitor Cc1 and the second capacitor Cc2 are respectively charged under the action of the reset voltage VRST at the input end of the residual amplifier AMP1. At this time, the charge conservation expression at the non-inverting input end of the residual amplifier AMP1 can be listed as follows (the same applies to the inverting input end of the residual amplifier AMP1):

$$(VIP0 - VRST)CN1 + (VCMOUT - VRST)Cf1 - VRST * Cc1 = Q.$$

2) During the working stage of the residual amplifier AMP1, the first switch SW11, and the second switch SW12 are both turned off, the third switch SW13, and the fourth switch SW14 are both turned on, the first switch unit is turned off, the second switch unit is turned on, and the high slew rate amplifier AMP2 starts to work. Due to the existence of parasitic capacitors Cp1 to Cp2, the signal at the non-inverting input end and the signal at the inverting input end of the residual amplifier AMP1 are both pulled down, and the common-mode value of the two input ends loaded on the inverting input end of the high slew rate amplifier AMP2 is also pulled down to be lower than the reset voltage VRST. Therefore, the output voltage VAMP of the high slew rate amplifier AMP2 changes from zero to a positive value. Since the high slew rate amplifier AMP2 is a high slew rate amplifier, it can adjust the value of the output voltage VAMP in a very short time. At the same time, the ends of the first capacitor Cc1 (and the second capacitor Cc2) that are originally grounded are connected to the positive voltage VAMP, and the ends of the first capacitor Cc1 (and the second capacitor Cc2) that are connected to the residual amplifier AMP 1 are raised accordingly, so that the common-mode value of the input signal loaded on the inverting input end of the high slew rate amplifier AMP2 is also raised by a certain amount, but due to the pull-down of the parasitic capacitance Cp1, it is still less than the reset voltage VRST, the positive value of the output voltage VAMP of the high slew rate amplifier AMP2 becomes smaller, and the voltage of the ends of the first capacitor Cc1 (and the second capacitor Cc2) that are connected to the residual amplifier AMP1 is raised slightly. This cycle repeats. Within a certain period of time, under the action of the high slew rate amplifier AMP2, the voltage of the ends of the first capacitor Cc1 (and the second capacitor Cc2) that are connected to the residual amplifier AMP1 is incrementally increased multiple times (the increased amount is getting smaller and smaller), and finally the common-mode value of the input signal loaded on the inverting input end of the high slew rate amplifier AMP2 is infinitely close to the reset voltage VRST, so as to achieve the effect of suppressing attenuation. That is to say, the common-mode value of the input signal of the residual amplifier AMP1 is compensated and adjusted by the high slew rate amplifier AMP2. Considering the parasitic capacitance Cp1, the charge conservation expression at the non-inverting input end of the residual amplifier AMP1 can be listed as follows (the same applies to the inverting input end of the residual amplifier AMP1):

$$(VREFH - Vx)CN1/2 + (VREFL - Vx)CN1/2 + (VCMOUT - Vx)Cf1 + (VAMP - Vx)Cc1 - VxCp1 = Q.$$

Due to charge conservation, Vx can be solved as follows:

$$Vx = [(CN1 + Cf1 + Cc1) * VRST + VAMP * Cc1] / (CN1 + Cf1 + Cc1 + Cp1).$$

It can be seen that, after the first capacitor Cc1 is added, the value of Vx can be compensated to a certain extent so that it will not decay very drastically.

It should be emphasized that in the above input common-mode compensation circuit, during the reset stage, the energy storage module is charged for the first time through the reset voltage VRST to store a portion of the charge to ensure that partial compensation can be performed at the beginning of the working stage such that the parasitic capacitor Cp1 does not pull down the common-mode value of the input signal too much. During the working stage, the energy storage module is compensated for the second time through the high slew rate amplifier AMP2 and the external reset voltage VRST to achieve the second charging to gradually pull up the common-mode value of the input signal toward the reset voltage VRST.

In some embodiments of the present application, in order to further verify the advantages of the above input common-mode compensation circuit, under a 28 nm CMOS process, the above input common-mode compensation circuit is applied to an MDAC of a high-speed pipelined analog-to-digital converter. The operating speed of the MDAC is 1 GHz (i.e., the total time of sampling status and working status is 1 nanosecond), the closed-loop gain of the residual amplifier AMP1 is 4 times, the number of sampling units is 8, and the type of switch is related to the signal connected to it. The switch connected to the high reference voltage VREFH is a PMOSFET switch, the switch connected to the low reference voltage VREFL is an NMOSFET switch, the switch connected to the ground level is an NMOSFET switch, and the switch connected to the output voltage of the residual amplifier AMP1 is a transmission gate switch. The structure of the high slew rate amplifier AMP2 adopts the ordinary OTA operational amplifier structure, which requires a relatively large current to meet the slew rate requirements so that the output voltage VAMP reaches a suitable value within one clock cycle. The above input common-mode compensation circuit is constructed and simulated, the external input signals (VIP0 and VIN0) are common-mode signals, and the reset voltage VRST is 800 mV.

Figure 3:
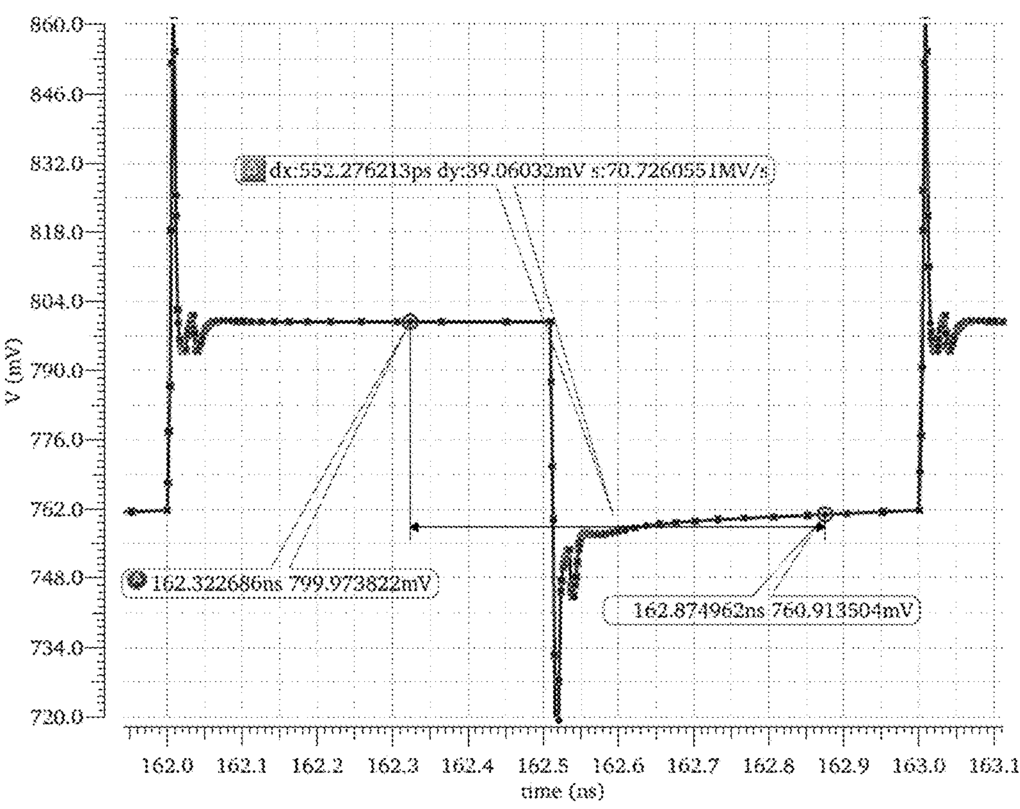
FIG. 3 shows a diagram of simulation results of a common-mode value of an input signal of a residual amplifier in a high-speed pipelined analog-to-digital converter in which input common-mode compensation is not applied.
Figure 4:
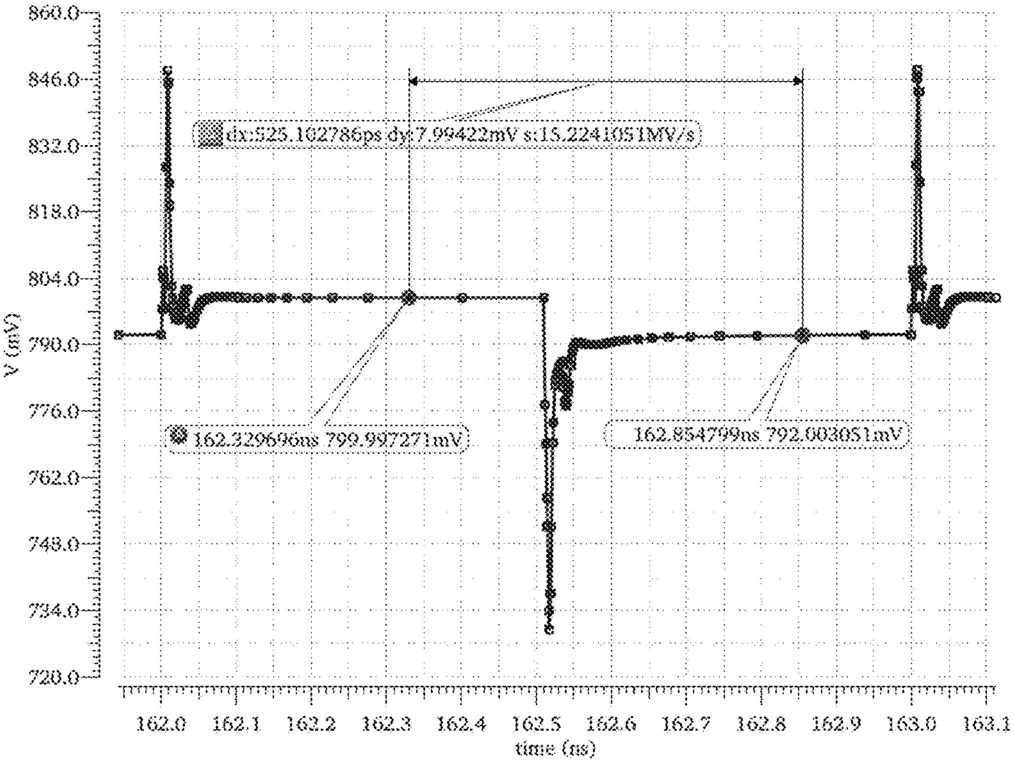
FIG. 4 shows a diagram of simulation results of a common-mode value of an input signal of a residual amplifier in a high-speed pipelined analog-to-digital converter in which input common-mode compensation is applied.
Figure 5:
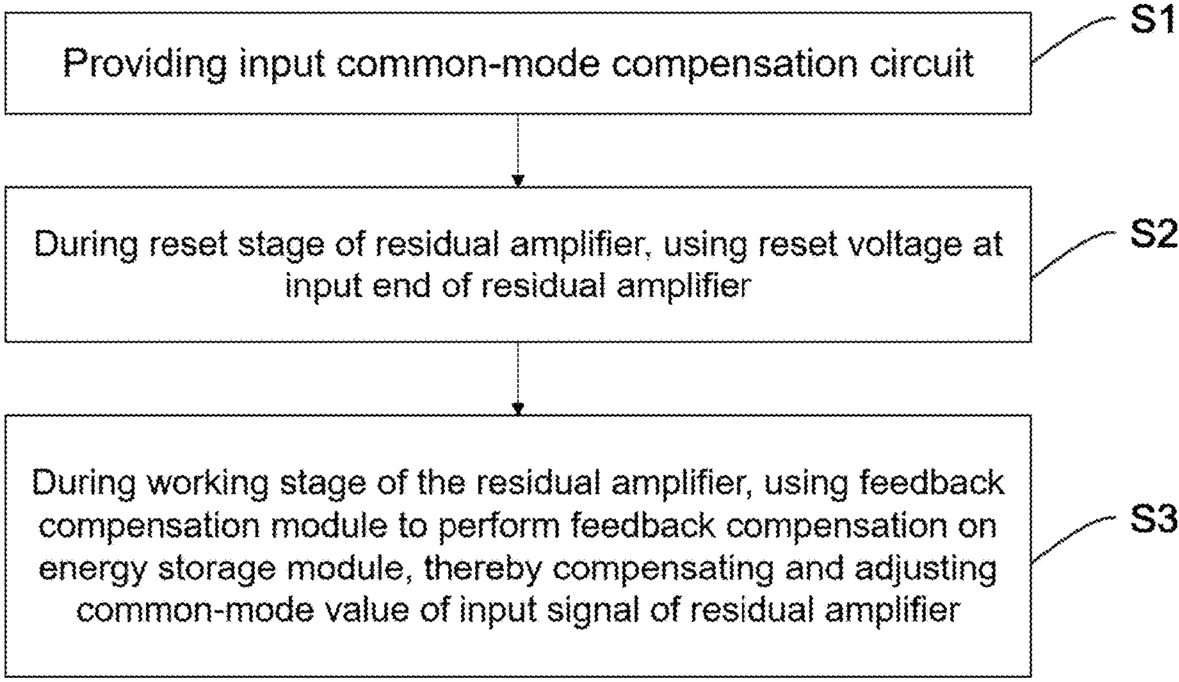
FIG. 5 shows a flow chart of an input common-mode compensation method according to one or more embodiments of the present application.

The situation where no input common-mode compensation circuit of the present application is provided will be described below, in order to compare with the situation where an input common-mode compensation circuit of the present application is provided. The simulation results of the situation where no input common-mode compensation circuit of the present application is provided are shown in FIG. 3. During the reset stage, the input common-mode value of the residual amplifier AMP1 is 800 mV (799.97 mV). During the working stage, due to the influence of the parasitic capacitance of the reset switch, the input common-mode value is attenuated to 760 mV, i.e., attenuated by 40 mV. The simulation results of the situation where the input common-mode compensation circuit of the present application is added are shown in FIG. 4. It can be seen that the attenuation value is only 8 mV, which fully illustrates the inhibitory effect of the input common-mode compensation circuit of the present application on the input common-mode attenuation caused by parasitic capacitance. In addition, the input common-mode compensation circuit does not affect the normal amplification function of the residual amplifier AMP1 for the differential mode signal.

Moreover, the present application also provides a pipelined analog-to-digital converter, which includes the above-mentioned input common-mode compensation circuit, the input common-mode compensation circuit is connected to the input end of the residual amplifier in the pipelined analog-to-digital converter, and the input common-mode compensation circuit compensates and adjusts the common-mode value of the input signal of the residual amplifier to suppress the input common-mode attenuation phenomenon of the residual amplifier in the working state caused by the parasitic capacitance of the reset switch, thereby ensuring the stability of the common-mode value of the residual amplifier, and further ensuring the stable performance of the pipelined analog-to-digital converter.

Finally, the present application also provides an input common-mode compensation method for compensating and adjusting the common-mode value of the input signal of the residual amplifier in the pipelined analog-to-digital converter. The input common-mode compensation method includes the following steps.

- S1: providing the above-mentioned input common-mode compensation circuit;
- S2: during the reset stage of the residual amplifier, using the reset voltage at the input end of the residual amplifier to charge the energy storage module;
- S3: during the working stage of the residual amplifier, using the feedback compensation module to perform feedback compensation on the energy storage module, thereby compensating and adjusting the common-mode value of the input signal of the residual amplifier.

In some embodiments of the present application, in steps S2 to S3, through the first charging to the energy storage module and the second compensative charging to the energy storage module by the feedback compensation module, during the working stage of the residual amplifier, the common-mode value of the input signal of the differential amplifier can be pulled close to the reset voltage, thereby effectively suppressing the common-mode attenuation of the input signal of the differential amplifier.

In summary, in the input common-mode compensation circuit, the pipelined analog-to-digital converter, and the input common-mode compensation method provided by the present application, during the reset stage of the residual amplifier, the energy storage module is charged under the action of the reset voltage, and during the working stage of the residual amplifier, feedback compensation is performed on the energy storage module by the feedback compensation module. Through the primary charging during the reset stage and the secondary compensative charging during the working stage, the common-mode value of the input signal of the residual amplifier during the working stage can be compensated and adjusted, and the input common-mode attenuation phenomenon of the residual amplifier in the working state caused by the parasitic capacitance of the reset switch can be effectively suppressed without affecting the normal operation of the residual amplifier, thereby ensuring the stability of the common-mode value of the residual amplifier, and further ensuring the stable performance of the pipelined analog-to-digital converter.

The present application is to provide an input common-mode compensation scheme for a residual amplifier in a pipelined analog-to-digital converter to compensate for the common-mode attenuation caused by parasitic capacitance, so that the input common-mode value of the residual amplifier during the working stage is as close to the reset value as possible without excessive attenuation, thereby preventing the performance of the residual amplifier from being deteriorated due to common-mode attenuation.

As described above, the input common-mode compensation circuit, the pipelined analog-to-digital converter, and the input common-mode compensation method provided by the present application have at least the following beneficial effects.

The entire input common-mode compensation circuit is based on the structural design of "energy storage module+switching selection module+feedback compensation module". During the reset stage of the residual amplifier, the energy storage module is charged under the action of the reset voltage. During the working stage of the residual amplifier, the energy storage module is feedback-compensated by the feedback compensation module, and then the common-mode value of the input signal of the residual amplifier is compensated and adjusted. It can effectively suppress the input common-mode attenuation phenomenon of the residual amplifier in the working state caused by the parasitic capacitance of the reset switch without affecting the normal operation of the residual amplifier, thereby ensuring the stability of the common-mode value of the residual amplifier, and then ensuring the stable performance of the pipelined analog-to-digital converter.

The above embodiments are merely illustrative of the principles and effects of the present application and are not intended to limit the present application. Anyone familiar with the art may modify or alter the above embodiments without departing from the spirit and scope of the present application. Therefore, all equivalent modifications or alterations made by a person of ordinary skill in the art without departing from the spirit and technical ideas disclosed by the present application shall still be covered by the claims of the present application.

What is claimed is:

1. An input common-mode compensation circuit used for compensating a common-mode value of an input signal of a residual amplifier in a pipelined analog-to-digital converter, comprising:

an energy storage module, wherein a first end of the energy storage module is connected to an input end of the residual amplifier;

a switching selection module, wherein an input end of the switching selection module is connected to a second end of the energy storage module, and a first output end of the switching selection module is grounded; and a feedback compensation module, wherein a first input end of the feedback compensation module is connected to the first end of the energy storage module, a second input end of the feedback compensation module is connected to a reset voltage of the residual amplifier, and an output end of the feedback compensation module is connected to a second output end of the switching selection module, wherein during a reset stage of the residual amplifier, the input end of the switching selection module is connected to the first output end of the switching selection module, and the energy storage module is charged under the action of the reset voltage, and during a working stage of the residual amplifier, the input end of the switching selection module is connected to the second output end of the switching selection module, and feedback compensation is applied to the energy storage module by the feedback compensation module, thereby compensating and adjusting the common-mode value of the input signal of the residual amplifier.

2. The input common-mode compensation circuit according to claim 1, wherein the energy storage module includes a first capacitor and a second capacitor, a first end of the first capacitor is connected to a non-inverting input end of the residual amplifier, and a first end of the second capacitor is connected to an inverting input end of the residual amplifier.

3. The input common-mode compensation circuit according to claim 2, wherein the switching selection module includes a first switch unit and a second switch unit, the first switch unit includes a first switch and a second switch, an input end of the first switch is connected to a second end of the first capacitor, an output end of the first switch is grounded, an input end of the second switch is connected to a second end of the second capacitor, and an output end of the second switch is grounded; and the second switch unit includes a third switch and a fourth switch, an input end of the third switch is connected to the second end of the first capacitor, and an input end of the fourth switch is connected to the second end of the second capacitor.

4. The input common-mode compensation circuit according to claim 3, wherein the feedback compensation module includes a high slew rate amplifier, a first resistor, and a second resistor, an inverting input end of the high slew rate amplifier is connected to the non-inverting input end of the residual amplifier via the first resistor connected in series, the inverting input end of the high slew rate amplifier is also connected to the inverting input end of the residual amplifier via the second resistor connected in series, and a non-inverting input end of the high slew rate amplifier is connected to the reset voltage, and an output end of the high slew rate amplifier is respectively connected to an output end of the third switch and an output end of the fourth switch.

5. The input common-mode compensation circuit according to claim 4, wherein during the reset stage of the residual amplifier, the first switch and the second switch are both turned on, the third switch and the fourth switch are both turned off, the first switch unit is turned on, the second switch unit is turned off, and the first capacitor and the second capacitor are respectively charged under the action of the reset voltage, and during the working stage of the residual amplifier, the first switch and the second switch are both turned off, the third switch and the fourth switch are both turned on, the first switch unit is turned off, the second switch unit is turned on, and the common-mode value of the input signal of the residual amplifier is compensated and adjusted by the high slew rate amplifier.

6. The input common-mode compensation circuit according to claim 4, wherein a capacitance of the first capacitor is equal to a capacitance of the second capacitor, and a resistance of the first resistor is equal to a resistance of the second resistor.

7. A pipelined analog-to-digital converter, comprising: an input common-mode compensation circuit, wherein the input common-mode compensation circuit includes:

an energy storage module, wherein a first end of the energy storage module is connected to an input end of a residual amplifier;

a switching selection module, wherein an input end of the switching selection module is connected to a second end of the energy storage module, and a first output end of the switching selection module is grounded; and a feedback compensation module, wherein a first input end of the feedback compensation module is connected to the first end of the energy storage module, a second input end of the feedback compensation module is connected to a reset voltage of the residual amplifier, and an output end of the feedback compensation module is connected to a second output end of the switching selection module, wherein during a reset stage of the residual amplifier, the input end of the switching selection module is connected to the first output end of the switching selection module, and the energy storage module is charged under the action of the reset voltage, and during a working stage of the residual amplifier, the input end of the switching selection module is connected to the second output end of the switching selection module, and feedback compensation is applied to the energy storage module by the feedback compensation module, thereby compensating and adjusting a common-mode value of an input signal of the residual amplifier;

the input common-mode compensation circuit is connected to the input end of the residual amplifier in the pipelined analog-to-digital converter, and the input common-mode compensation circuit compensates and adjusts a common-mode value of the input signal of the residual amplifier.

8. The pipelined analog-to-digital converter according to claim 7, wherein the energy storage module includes a first capacitor and a second capacitor, a first end of the first capacitor is connected to a non-inverting input end of the residual amplifier, and a first end of the second capacitor is connected to an inverting input end of the residual amplifier.

9. The pipelined analog-to-digital converter according to claim 8, wherein the switching selection module includes a first switch unit and a second switch unit, the first switch unit includes a first switch and a second switch, an input end of the first switch is connected to a second end of the first capacitor, an output end of the first switch is grounded, an input end of the second switch is connected to a second end of the second capacitor, and an output end of the second switch is grounded; and the second switch unit includes a third switch and a fourth switch, an input end of the third switch is connected to the second end of the first capacitor, and an input end of the fourth switch is connected to the second end of the second capacitor.

10. The pipelined analog-to-digital converter according to claim 9, wherein the feedback compensation module includes a high slew rate amplifier, a first resistor, and a second resistor, an inverting input end of the high slew rate amplifier is connected to the non-inverting input end of the residual amplifier via the first resistor connected in series, the inverting input end of the high slew rate amplifier is also connected to the inverting input end of the residual amplifier via the second resistor connected in series, and a non-inverting input end of the high slew rate amplifier is connected to the reset voltage, and the output end of the high slew rate amplifier is respectively connected to an output end of the third switch and an output end of the fourth switch.

11. The pipelined analog-to-digital converter according to claim 10, wherein during the reset stage of the residual amplifier, the first switch and the second switch are both turned on, the third switch and the fourth switch are both turned off, the first switch unit is turned on, the second switch unit is turned off, and the first capacitor and the second capacitor are respectively charged under the action of the reset voltage, and during the working stage of the residual amplifier, the first switch and the second switch are both turned off, the third switch and the fourth switch are both turned on, the first switch unit is turned off, the second switch unit is turned on, and the common-mode value of the input signal of the residual amplifier is compensated and adjusted by the high slew rate amplifier.

12. The pipelined analog-to-digital converter according to claim 10, wherein a capacitance of the first capacitor is equal to a capacitance of the second capacitor, and a resistance of the first resistor is equal to a resistance of the second resistor.

13. An input common-mode compensation method for compensating and adjusting a common-mode value of an input signal of a residual amplifier in a pipelined analog-to-digital converter, comprising:

providing an input common-mode compensation circuit including:

an energy storage module, wherein a first end of the energy storage module is connected to an input end of a residual amplifier;

a switching selection module, wherein an input end of the switching selection module is connected to a second end of the energy storage module, and a first output end of the switching selection module is grounded; and a feedback compensation module, wherein a first input end of the feedback compensation module is connected to the first end of the energy storage module, a second input end of the feedback compensation module is connected to a reset voltage of the residual amplifier, and an output end of the feedback compensation module is connected to a second output end of the switching selection module, wherein during a reset stage of the residual amplifier, the input end of the switching selection module is connected to the first output end of the switching selection module, and the energy storage module is charged under the action of the reset voltage, and during a working stage of the residual amplifier, the input end of the switching selection module is connected to the second output end of the switching selection module, and feedback compensation is applied to the energy storage module by the feedback compensation module, thereby compensating and adjusting a common-mode value of an input signal of the residual amplifier, during the reset stage of the residual amplifier, using the reset voltage at the input end of the residual amplifier to charge the energy storage module; and during the working stage of the residual amplifier, using a feedback compensation module to perform feedback compensation on the energy storage module, thereby compensating and adjusting the common-mode value of the input signal of the residual amplifier.

14. The input common-mode compensation method according to claim 13, wherein the energy storage module includes a first capacitor and a second capacitor, a first end of the first capacitor is connected to a non-inverting input end of the residual amplifier, and a first end of the second capacitor is connected to an inverting input end of the residual amplifier.

15. The input common-mode compensation method according to claim 14, wherein the switching selection module includes a first switch unit and a second switch unit, the first switch unit includes a first switch and a second switch, an input end of the first switch is connected to a second end of the first capacitor, an output end of the first switch is grounded, an input end of the second switch is connected to a second end of the second capacitor, and an output end of the second switch is grounded; and the second switch unit includes a third switch and a fourth switch, an input end of the third switch is connected to the second end of the first capacitor, and an input end of the fourth switch is connected to the second end of the second capacitor.

16. The input common-mode compensation method according to claim 15, wherein the feedback compensation module includes a high slew rate amplifier, a first resistor, and a second resistor, an inverting input end of the high slew rate amplifier is connected to the non-inverting input end of the residual amplifier via the first resistor connected in series, the inverting input end of the high slew rate amplifier is also connected to the inverting input end of the residual amplifier via the second resistor connected in series, and a non-inverting input end of the high slew rate amplifier is connected to the reset voltage, and the output end of the high slew rate amplifier is respectively connected to an output end of the third switch and an output end of the fourth switch.

17. The input common-mode compensation method according to claim 16, wherein during the reset stage of the residual amplifier, the first switch and the second switch are both turned on, the third switch and the fourth switch are both turned off, the first switch unit is turned on, the second switch unit is turned off, and the first capacitor and the second capacitor are respectively charged under the action of the reset voltage, and during the working stage of the residual amplifier, the first switch and the second switch are both turned off, the third switch and the fourth switch are both turned on, the first switch unit is turned off, the second switch unit is turned on, and the common-mode value of the input signal of the residual amplifier is compensated and adjusted by the high slew rate amplifier.

18. The input common-mode compensation method according to claim 16, wherein a capacitance of the first capacitor is equal to a capacitance of the second capacitor, and a resistance of the first resistor is equal to a resistance of the second resistor.

* * * * *